US012158495B2

(12) United States Patent
Choi et al.

(10) Patent No.: US 12,158,495 B2
(45) Date of Patent: Dec. 3, 2024

(54) METHOD AND APPARATUS FOR DIAGNOSING ELECTRONIC APPARATUS

(71) Applicant: Samsung Electronics Co., Ltd., Suwon-si (KR)

(72) Inventors: Hangseok Choi, Suwon-si (KR); Sangwoo Kang, Suwon-si (KR); Kwangyoon Lee, Suwon-si (KR); Chuleun Yun, Suwon-si (KR); Cheolha Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 17/966,456

(22) Filed: Oct. 14, 2022

(65) Prior Publication Data

US 2023/0160952 A1 May 25, 2023

Related U.S. Application Data

(63) Continuation of application No. PCT/KR2022/013365, filed on Sep. 6, 2022.

(30) Foreign Application Priority Data

Nov. 24, 2021 (KR) .......................... 10-2021-0163436
Dec. 13, 2021 (KR) .......................... 10-2021-0177420

(51) Int. Cl.
*G01R 31/28* (2006.01)
*G01R 27/28* (2006.01)
(Continued)

(52) U.S. Cl.
CPC .......... *G01R 31/2844* (2013.01); *G01R 27/28* (2013.01); *H02J 4/00* (2013.01); *H03K 17/0822* (2013.01)

(58) Field of Classification Search
CPC .. G01R 27/28; G01R 31/282; G01R 31/2844; H02J 4/00; H02J 13/00009;
(Continued)

(56) References Cited

U.S. PATENT DOCUMENTS 4,100,601 A * 7/1978 Kaufman ............ G06F 13/4022
714/E11.053
5,649,094 A * 7/1997 Hayashi ............... H04N 17/045
702/108

(Continued)

FOREIGN PATENT DOCUMENTS

CN 104075735 B 2/2017
JP 2012-003565 A 1/2012

(Continued)

OTHER PUBLICATIONS

International Search Report and Written Opinion dated Dec. 16, 2022, issued in International Patent Application No. PCT/KR2022/013365.

*Primary Examiner* — Vinh P Nguyen
(74) *Attorney, Agent, or Firm* — Jefferson IP Law, LLP

(57) ABSTRACT

A method and an apparatus for diagnosing an electronic apparatus are provided. The device for diagnosing an electronic device includes a master diagnosis block that generates a control signal when a diagnosis mode is started, a multiplexer that sequentially outputs a diagnosis power through a diagnosis power path based on the control signal, a slave diagnosis block that is sequentially supplied the diagnosis power through the diagnosis power path and generates diagnosis data of a power management circuit of the electronic device by using the diagnosis power, a modulator that transmits the diagnosis data by modulating a power signal of the diagnosis power path, and a demodulator that receives the diagnosis data by demodulating the power signal of the diagnosis power path and provides the diagnosis data to the master diagnosis block.

20 Claims, 9 Drawing Sheets

(51) Int. Cl.
*H02J 4/00* (2006.01)
*H03K 17/082* (2006.01)

(58) Field of Classification Search
CPC .......... H02J 13/00028; H02J 13/00034; H03K 17/0822; H03K 7/02; G06F 13/38; G06F 13/4068; G06F 13/124; G06F 3/0625; G06F 1/3234; G06F 3/061; G06F 13/42
See application file for complete search history.

(56) References Cited

U.S. PATENT DOCUMENTS

| | | | |
|---|---|---|---|
| 8,018,886 B2 * | 9/2011 | Song | H04W 4/06 |
| | | | 370/312 |
| 8,150,647 B2 * | 4/2012 | Hata | G01R 31/3016 |
| | | | 702/120 |
| 9,817,461 B2 * | 11/2017 | Ohida | G06F 1/28 |
| 10,545,555 B2 * | 1/2020 | Han | G06F 1/3296 |
| 11,347,253 B2 * | 5/2022 | Park | G05F 1/625 |

FOREIGN PATENT DOCUMENTS

| | | |
|---|---|---|
| JP | 2015-108593 A | 6/2015 |
| JP | 6695214 B2 | 5/2020 |
| JP | 6825975 B2 | 2/2021 |
| KR | 10-1627219 B1 | 6/2016 |
| KR | 10-2017-0030338 A | 3/2017 |
| KR | 10-2017-0089158 A | 8/2017 |
| KR | 10-1913385 B1 | 10/2018 |
| KR | 10-2021-0060067 A | 5/2021 |

* cited by examiner

METHOD AND APPARATUS FOR DIAGNOSING ELECTRONIC APPARATUS

CROSS-REFERENCE TO RELATED APPLICATION(S)

This application is continuation application, claiming priority under § 365(c), of an International Application No. PCT/KR2022/013365, filed on Sep. 6, 2022, which is based on and claims the benefit of a Korean patent application number 10-2021-0163436, filed on Nov. 24, 2021, in the Korean Intellectual Property Office, and of a Korean patent application number 10-2021-0177420, filed on Dec. 13, 2021, in the Korean Intellectual Property Office, the disclosure of each of which is incorporated by reference herein in its entirety.

BACKGROUND

1. Field

The disclosure relates to a method and apparatus for diagnosing an abnormality or a fault in an electronic apparatus.

2. Description of Related Art

A self-diagnosis device may be installed in a system to identify an abnormality or a fault quickly and accurately in the system, and a way for coping with the abnormality may be easily determined based on the diagnosis of the self-diagnosis apparatus. A conventional diagnosis device has been applied to some computing products. The conventional diagnosis device mainly uses inter-integrated circuit (I2C)-based communication and requires two communication lines on each chipset for communication. The diagnosis device may perform the self-diagnosis by using a dedicated power source regardless of whether each chipset is burned out. Recently, the area of the main board is getting smaller and a high-density structure such as a three-sided mounting or a four-sided mounting using an interposer structure to mount many components such as an application processor (AP) and a power management integrated circuit (PMIC) in a limited area is being applied to the main board.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and apparatus for diagnosing an electronic apparatus.

Additional aspects will be set forth in part in the description which follows and, in part, will be apparent from the description, or may be learned by practice of the presented embodiments.

In accordance with an aspect of the disclosure, a device for diagnosing an electronic device is provided. The device includes a master diagnosis block that generates a control signal when a diagnosis mode is started, a multiplexer that sequentially outputs diagnosis power through a diagnosis power path based on the control signal, a slave diagnosis block that is supplied the diagnosis power sequentially through the diagnosis power path and generates diagnosis data of a power management circuit of the electronic device by using the diagnosis power, a modulator that transmits the diagnosis data by modulating a power signal of the diagnosis power path, and a demodulator that receives the diagnosis data by demodulating the power signal of the diagnosis power path and provides the diagnosis data to the master diagnosis block.

In accordance with another aspect of the disclosure, a method for diagnosing the electronic device is provided. The method includes generating the control signal when the diagnosis mode is started, sequentially providing the diagnosis power to the slave diagnosis block through the diagnosis power path based on the control signal, and obtaining the diagnosis data by demodulating the power signal of the diagnosis power path when the power signal of the diagnosis power path is modulated based on the diagnosis data of the power management circuit of the electronic device generated using the diagnosis power.

In accordance with another aspect of the disclosure, the electronic device is provided. The electronic device includes a diagnosis control circuit that outputs and provides the diagnosis power through the diagnosis power path, and the power management circuit that provides system power supplied through a system power path to a system element of the electronic device and performs a diagnosis using the diagnosis power supplied through the diagnosis power path, and the power management circuit may transmit the diagnosis data according to the diagnosis by modulating the power signal of the diagnosis power path and the diagnosis control circuit may receive the diagnosis data by demodulating the power signal of the diagnosis power path.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As high-density three-dimensional structures are applied to circuits, figuring out where a fault or burnout occurred in the circuit may be difficult. In a case in which a diagnosis power source for all chipsets is tied together, a short-circuit fault may occur in the diagnosis power source as a self-diagnosis block of one chipset that is burned out, and thus all chipsets connected to the diagnosis power source may not receive power, and thus the self-diagnosis of all chipsets may not function.

According to various embodiments, a self-diagnosis structure capable of accurately determining a location of a fault or burnout without high complexity is provided. According to various embodiments, even when the self-diagnosis block of a certain chipset is burned out, the self-diagnosis structure is provided in which the other part of a diagnosis system is not affected by the burnout. This diagnosis structure may improve the efficiency of fault analysis and repair in a case in which a fault occurs in a market product and may be used for system debugging in the development stage.

Figure 1:
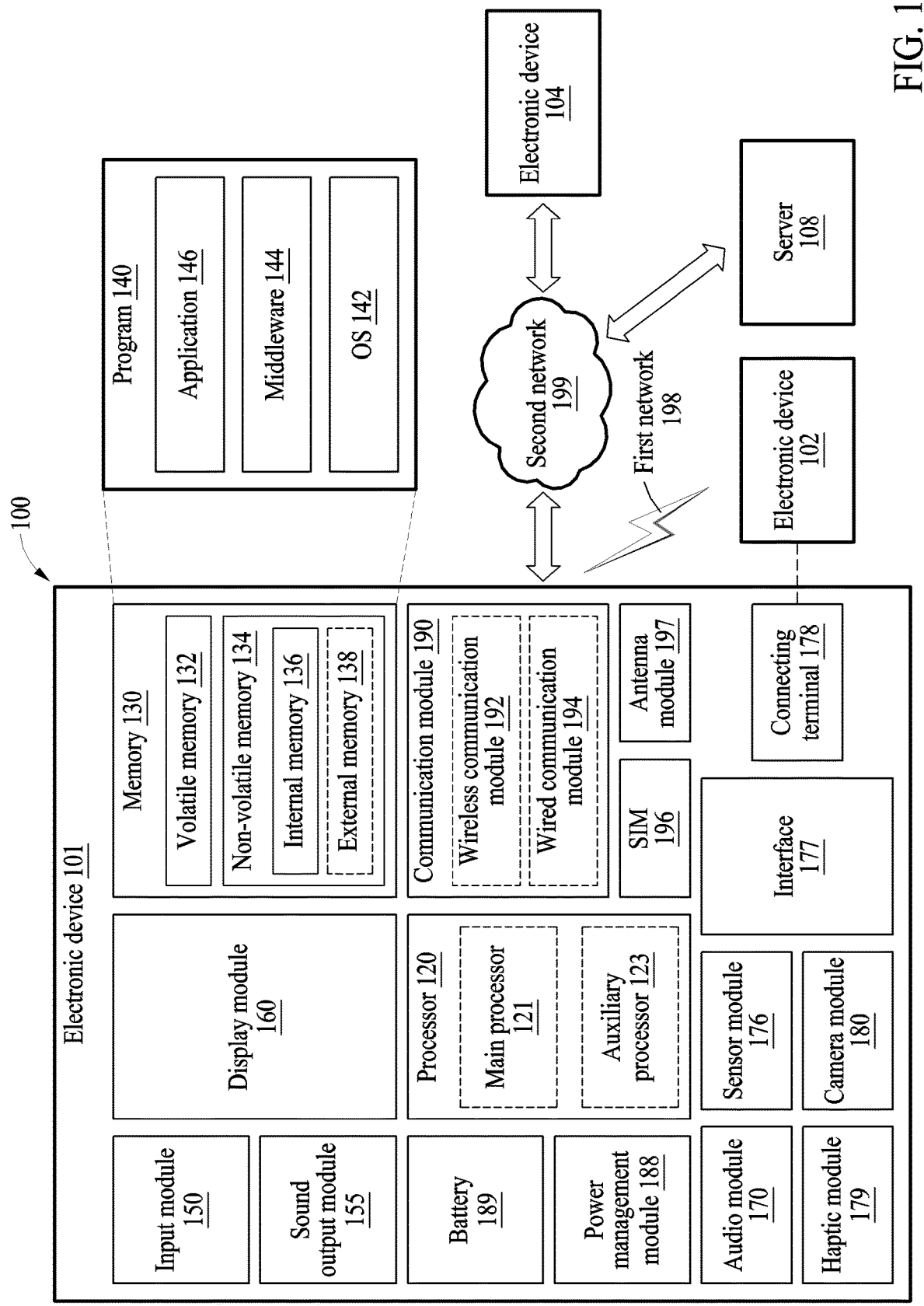
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to another embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added to the electronic device 101. In some embodiments, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computations. According to yet another embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to yet another embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, in a case in which the electronic device 101 includes the main processor 121 and the auxiliary processor 123, the auxiliary processor 123 may be adapted to consume less power than the main processor 121 or to be predetermined to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to yet another embodiment, the auxiliary processor 123 (e.g., an ISP or a CP) may be implemented as a portion of another component (e.g., the camera module 180 or the communication module 190) that is functionally related to the auxiliary processor 123. According to yet another embodiment, the auxiliary processor 123 (e.g., an NPU) may include a hardware structure specifically for artificial intelligence model processing. An artificial intelligence model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence (AI) model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. According to yet another embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control its corresponding one of the display, the hologram device, and the projector. According to yet another embodiment, the display module 160 may include a touch sensor adapted to detect a touch, or a pressure sensor adapted to measure the intensity of force of the touch.

The audio module 170 may convert sound into an electric signal or vice versa. According to yet another embodiment, the audio module 170 may obtain the sound via the input module 150 or output the sound via the sound output module 155 or an external electronic device (e.g., the electronic device 102 such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to yet another embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with the external electronic device (e.g., the electronic device 102) directly (e.g., by wire) or wirelessly. According to yet another embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). According to yet another embodiment, the connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus which may be recognized by a user via their tactile sensation or kinesthetic sensation. According to yet another embodiment, the haptic module 179 may include, for example, a motor, a piezoelectric element, or an electric stimulator.

The camera module 180 may capture a still image and moving images. According to yet another embodiment, the camera module 180 may include one or more lenses, image sensors, ISPs, and flashes.

The power management module 188 may manage power supplied to the electronic device 101. According to yet another embodiment, the power management module 188 may include a power management integrated circuit (PMIC).

The battery 189 may supply power to at least one component of the electronic device 101. According to yet another embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an application processor (AP)) and that support direct (e.g., wired) communication or wireless communication. According to yet another embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., a LAN or a wide area network (WAN))). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a millimeter wave (mmWave) band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large scale antenna. The wireless communication module 192 may support various requirements specified in the electronic device 101, an external electronic device (e.g., the electronic device 104), or a network system (e.g., the second network 199). According to yet another embodiment, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to yet another embodiment, the antenna module 197 may include an antenna including a radiating element including a conductive material or a conductive pattern formed in or on a substrate (e.g., a printed circuit board (PCB)). According to yet another embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to yet another embodiment, another component (e.g., a radio frequency integrated circuit (RFIC)) other than the radiating element may be additionally formed as a part of the antenna module 197.

According to various embodiments, the antenna module 197 may form a mmWave antenna module. According to yet another embodiment, the mmWave antenna module may include a PCB, an RFIC on a first surface (e.g., the bottom surface) of the PCB, or adjacent to the first surface of the PCB and capable of supporting a designated high-frequency band (e.g., a mmWave band), and a plurality of antennas (e.g., array antennas) disposed on a second surface (e.g., the top or a side surface) of the PCB, or adjacent to the second surface of the PCB and capable of transmitting or receiving signals of the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to yet another embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. According to yet another embodiment, all or some of operations to be executed by the electronic device 101 may be executed by one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, for example, distributed computing or MEC. In yet another embodiment, the external electronic device (e.g., the electronic device 104) may include an Internet-of-things (IoT) device. The server 108 may be an intelligent server using machine learning and/or a neural network. According to yet another embodiment, the external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

Figure 2:
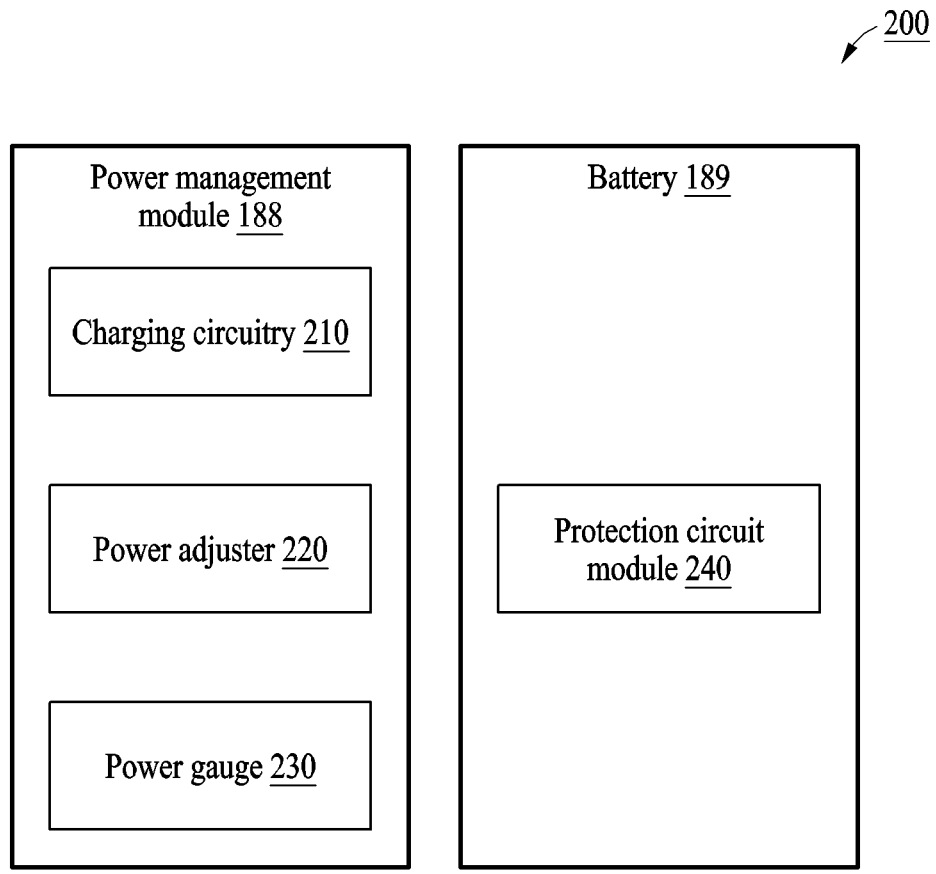
FIG. 2 is a block diagram illustrating a power management module and a battery according to an embodiment of the disclosure.

FIG. 2 is a block diagram illustrating a power management module and a battery according to an embodiment of the disclosure.

Referring to FIG. 2, in a block diagram 200, the power management module 188 may include a charging circuitry 210, a power adjuster 220, or a power gauge 230. The charging circuitry 210 may charge the battery 189 using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watts or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to another embodiment, the power adjuster 220 may be implemented in the form of a low drop out (LDO) regulator or a switching regulator. The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based, at least in part on, the measured use state information about the battery 189. The power management module 188 may determine whether the state of the battery 189 is normal or abnormal based at least in part on the determined charging state information. If the state of the battery 189 is determined to be abnormal, the power management module 188 may adjust the charging of the battery 189 (e.g., reduce the charging current or voltage, or stop the charging). According to yet another embodiment, at least some of the functions of the power management module 188 may be performed by an external control device (e.g., the processor 120)

According to yet another embodiment, the battery 189 may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to yet another embodiment, at least part of the charging state information or use state information regarding the battery 189 may be measured using a corresponding sensor (e.g., a temperature sensor) of a sensor module 176, the power gauge 230, or the power management module 188. According to yet another embodiment, the corresponding sensor (e.g., the temperature sensor) of the sensor module 176 may be included as a part of the PCM 240 or may be disposed of near the battery 189 as a separate device.

Figure 3:
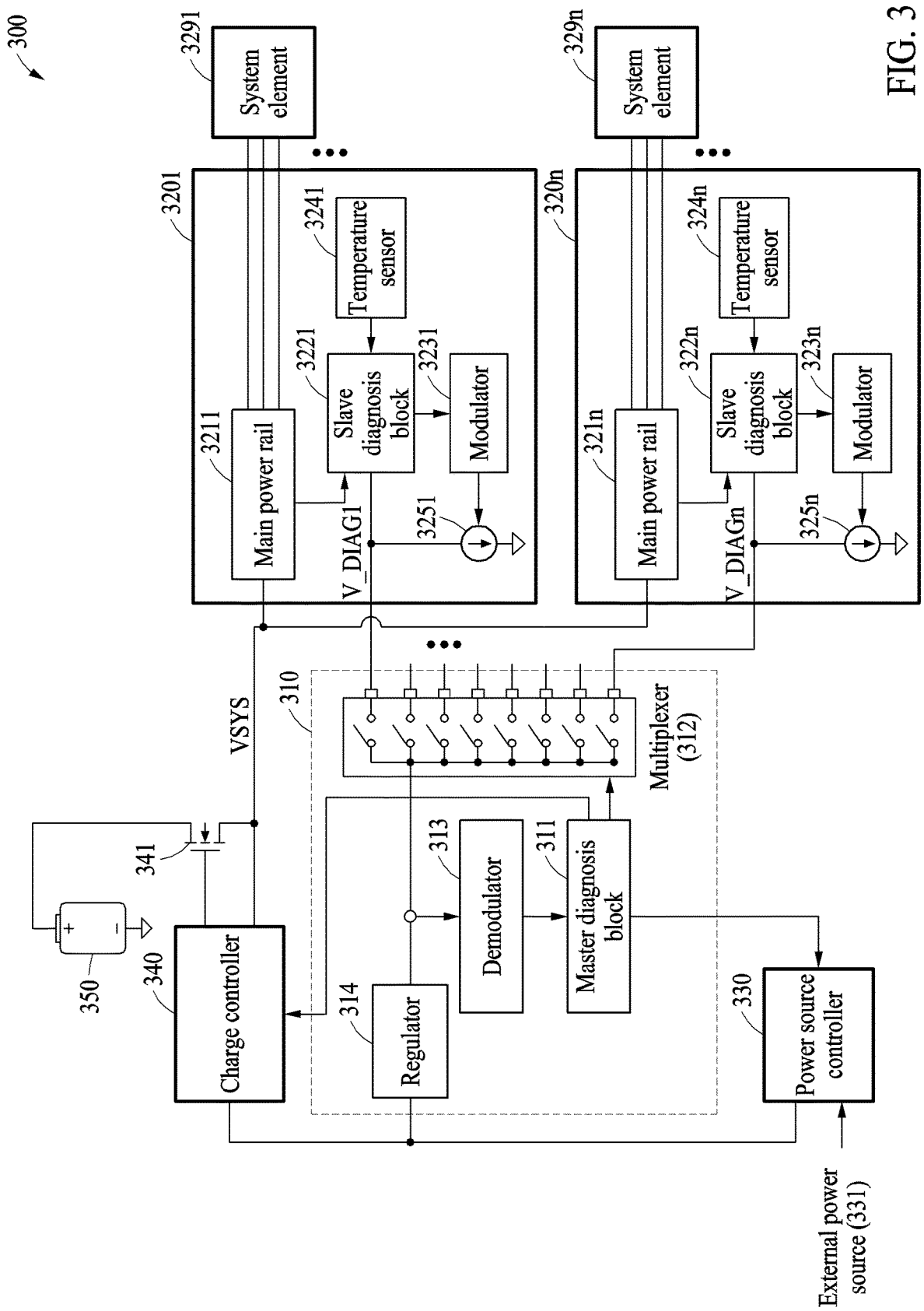
FIG. 3 is a diagram illustrating the electronic device including a diagnosis device according to an embodiment of the disclosure.

FIG. 3 is a diagram illustrating the electronic device including a diagnosis device according to an embodiment of the disclosure.

Referring to FIG. 3, an electronic device 300 (e.g., the electronic device 101) may include a diagnosis control circuit 310, power management circuits 3201 and 320n, a power source controller 330 (e.g., a power regulator), a charge controller 340 (e.g., the charging circuitry 210), and an inner power source 350 (e.g., the battery 189).

In an embodiment, the diagnosis control circuit 310 may include a master diagnosis block 311, a multiplexer 312, a demodulator 313, and a regulator 314. The power management circuit 3201 may include a main power rail 3211, a slave diagnosis block 3221, a modulator 3231, a temperature sensor 3241, and a current source 3251, and the power management circuit 320n may include a main power rail 321n, a slave diagnosis block 322n, a modulator 323n, a temperature sensor 324n, and a current source 325n. The power management circuits 3201 and 320n may correspond to the PMIC. The number of the power management circuits 3201 and 320n may be illustrated as two in FIG. 3, but the number of the power management circuits 3201 and 320n may be n which may be a natural number greater than or equal to 1.

In another embodiment, at least some of the diagnosis control circuit 310, the slave diagnosis blocks 3221 and 322n, the modulators 3231 and 323n, the temperature sensors 3241 and 324n, and the current sources 3251 and 325n may be installed in the electronic device 300, may provide a self-diagnosis function of the electronic device 300, and may be referred to as a diagnosis apparatus. At least some of the slave diagnosis blocks 3221 and 322n, the modulators 3231 and 323n, the temperature sensors 3241 and 324n, and the current sources 3251 and 325n may be disposed in the power management circuits 3201 and 320n.

In yet another embodiment, the electronic device 300 may provide a diagnosis mode in which the self-diagnosis is performed and the diagnosis device may perform the self-diagnosis in the diagnosis mode. In a case in which the diagnosis mode is started, the master diagnosis block 311 may control a power supply path by providing a control signal according to a diagnosis situation and may output a diagnosis result in a case in which the diagnosis is completed. For example, the master diagnosis block 311 may know the start of the diagnosis mode through the connection of an external power source 331 and may output the diagnosis result to the outside of the electronic device 300 through the power source controller 330.

In yet another embodiment, the charge controller 340 may provide the system power. The charge controller 340 may allow or block the supply of the system power to the power management circuits 3201 and 320n based on the control signal of the master diagnosis block 311. The charge controller 340 may provide the system power based on the external power source 331 or the inner power source 350. The charge controller 340 may receive external power from the external power source 331 through the power source controller 330 and provide the system power based on the external power. Alternatively, the charge controller 340 may provide the system power based on the internal power of the inner power source 350. The charge controller 340 may allow or block the supply of the internal power by controlling a charging switch 341 based on the control signal. For example, the charging switch 341 may be a battery field effect transistor (FET).

In an embodiment, the regulator 314 may generate diagnosis power in the diagnosis mode. The regulator 314 may receive the external power of the external power source 331 through the power source controller 330 and generate the diagnosis power based on the external power. Diagnosis voltages (V_DIAG1 to V_DIAGn) may be applied according to the diagnosis power. The multiplexer 312 may sequentially output the diagnosis power through a diagnosis power path based on the control signal.

In yet another embodiment, the diagnosis power path may refer to at least a part of paths through which the diagnosis power is supplied from the regulator 314 to the slave diagnosis blocks 3221 and 322n. The diagnosis power path may be distinguished from a system power path that supplies the system power to system elements 3291 and 329n. The power management circuits 3201 and 320n may supply the system power to the system elements 3291 and 329n. For example, the system elements 3291 and 329n may correspond to an individual functional element of the electronic device 300 such as the processor 120, the memory 130, the input module 150, the display module 160, the sound output module 155, and the audio module 170. The system power path may mean at least some of the paths through which the system power is supplied from the charge controller 340 to the system elements 3291 and 329n. A system voltage (VSYS) may be applied according to the system power.

In yet another embodiment, the slave diagnosis blocks 3221 and 322n may be supplied the diagnosis power sequentially through the diagnosis power path and generate diagnosis data of the power management circuits 3201 and 320n using the diagnosis power. The diagnosis data may include at least some of the temperature data and failure data of the power management circuits 3201 and 320n. The slave diagnosis blocks 3221 and 322n may acquire the temperature data using the temperature sensors 3241 and 324n and may acquire the failure data using the main power rails 3211 and 321n.

In yet another embodiment, the modulators 3231 and 323n may transmit the diagnosis data by modulating the power signal of the diagnosis power path. For example, the modulators 3231 and 323n may modulate the current of the current sources 3251 and 325n. The demodulator 313 may receive the diagnosis data by demodulating the power signal of the diagnosis power path and may provide the diagnosis data to the master diagnosis block 311. The master diagnosis block 311 may generate the diagnosis result based on the diagnosis data. This modulation and demodulation may correspond to powerline communication (PLC).

In yet another embodiment, the diagnosis may include a response checking and a data extraction. The response checking and the data extraction may be performed simultaneously. For example, the data (e.g., the temperature data) received from the slave diagnosis blocks 3221 and 322n may be regarded as a response. The master diagnosis block 311 may supply the diagnosis power to the slave diagnosis blocks 3221 and 322n by controlling the multiplexer 312 and identify whether the power management circuits 3201 and 320n are burned out, by checking the response of the slave diagnosis blocks 3221 and 322n. In a case in which there is an unresponsive block among the slave diagnosis blocks 3221 and 322n, it may be determined that there is a fault (e.g., burnout) in the corresponding block.

In yet another embodiment, in a case in which there is a response from the slave diagnosis blocks 3221 and 322n, the diagnosis data may be extracted from the slave diagnosis blocks 3221 and 322n based on the response. The data extraction may include a primary diagnosis and a secondary diagnosis. The slave diagnosis blocks 3221 and 322n may perform the primary diagnosis using the diagnosis power in a state in which the supply of the system power to the power management circuits 3201 and 320n is cut off and may perform the secondary diagnosis using the diagnosis power in a state in which the system power is supplied to the power management circuits 3201 and 320n. The temperature data of the power management circuits 3201 and 320n may be extracted through the primary diagnosis, and the temperature data and failure data of the power management circuits 3201 and 320n may be extracted through the secondary diagnosis.

In yet another embodiment, the temperature data extracted through the primary diagnosis may be referred to as primary temperature data and the temperature data extracted through the secondary diagnosis may be referred to as secondary temperature data. The master diagnosis block 311 may diagnose an overheating state of the power management circuits 3201 and 320n based on a difference between the primary temperature data and the secondary temperature data. The diagnosis power may be used for the primary diagnosis and the diagnosis power and the system power may be used for the secondary diagnosis. Since there is a time gap between the primary diagnosis and the secondary diagnosis, a difference may occur between the primary temperature data and the secondary temperature data. The difference between temperature values measured through two points of time may more accurately indicate the overheating state than a temperature value measured at one point of time. The accuracy may be formed high even in a case in which a low-cost sensor (e.g., a bipolar junction transistor (BJT)-based sensor) is used as the temperature sensors 3241 and 324n. The failure data may include an overcurrent record of a power rail between the main power rails 3211 and 321n and the system elements 3291 and 329n. For example, the overcurrent record may include a record of an overcurrent protection (OCP).

Figure 4:
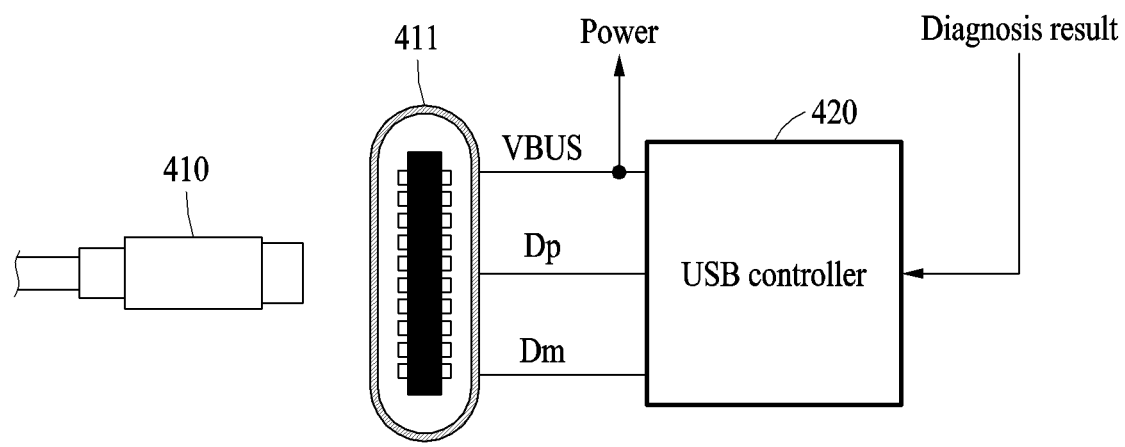
FIG. 4 is a diagram illustrating a universal serial bus (USB) controller according to an embodiment of the disclosure.

FIG. 4 is a diagram illustrating a universal serial bus (USB) controller according to an embodiment of the disclosure.

Referring to FIG. 4, a USB cable 410 may be connected to a USB connector 411 and a USB controller 420 may supply power to the electronic device (e.g., the electronic device 101 and the electronic device 300). A supply voltage (VBUS) may correspond to the power. The USB cable 410 may correspond to an example of the external power source 331 and the USB controller 420 may correspond to an example of the power source controller 330. The USB is only an example of a power source and the power source according to embodiments is not limited to the USB. The USB cable 410 may connect an external diagnosis device and the electronic device. The external diagnosis device and the electronic device (e.g., the master diagnosis block 311 of the electronic device 300) may exchange data (Dp, Dm). For example, the external diagnosis device may notify the electronic device of the start of the diagnosis mode through the USB cable 410, and the electronic device may perform the self-diagnosis in the diagnosis mode and transmit the diagnosis result to the external diagnosis device through the USB cable 410.

Figure 5:
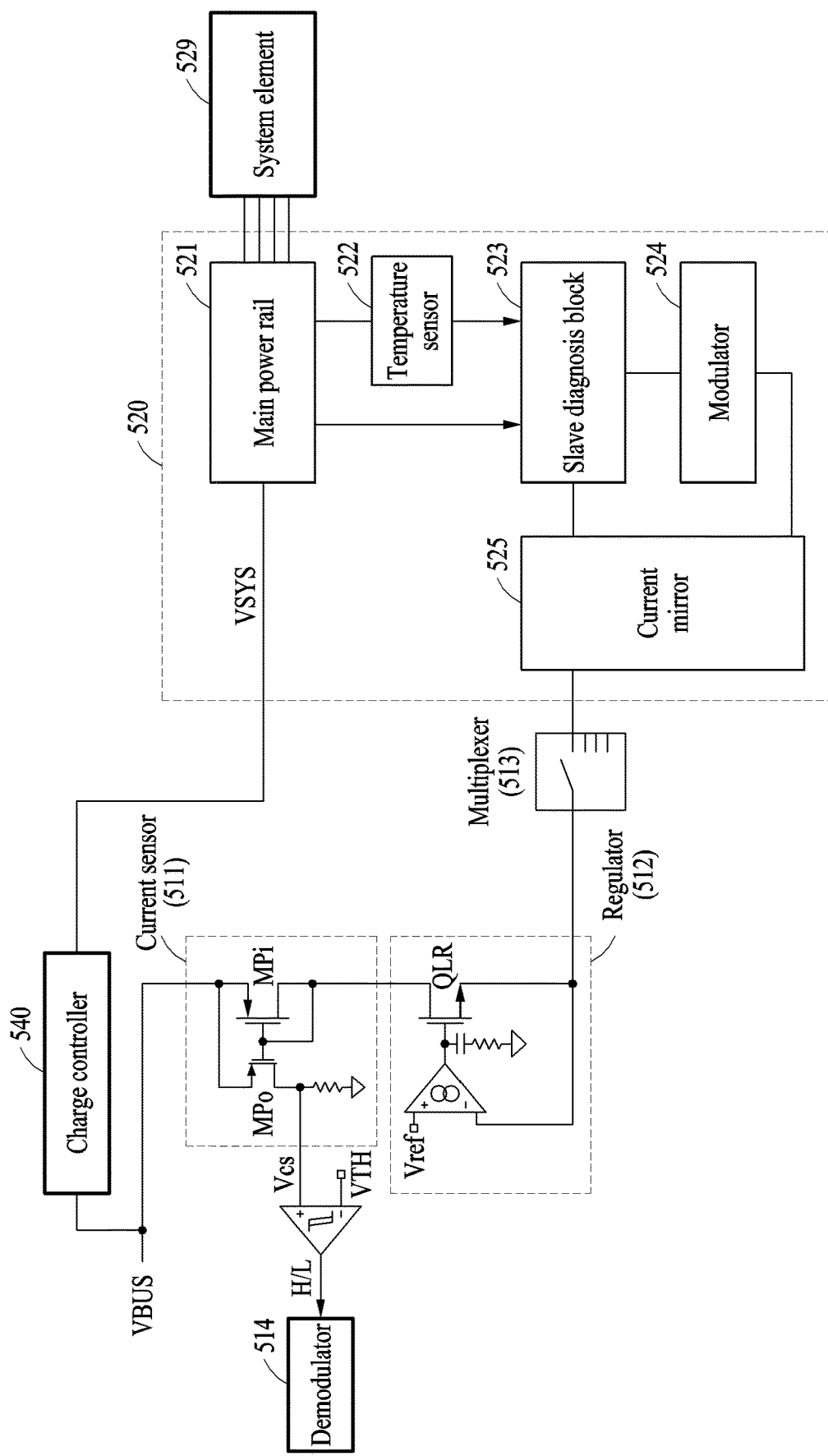
FIG. 5 is a configuration diagram illustrating performing a diagnosis according to an embodiment of the disclosure.

FIG. 5 is a configuration diagram illustrating performing diagnosis according to an embodiment of the disclosure.

Referring to FIG. 5, a regulator 512 (e.g., the regulator 314) may correspond to a linear regulator. The regulator 512 may compare a reference voltage (Vref) and an output voltage through a comparator and may adjust the output voltage through the control circuit (e.g., a transistor (QLR)). The output voltage may correspond to the diagnosis voltage (e.g., the diagnosis voltages (V_DIAG1 to V_DIAGn)). The diagnosis power may be supplied through the diagnosis voltage. The diagnosis voltage may be applied to a slave diagnosis block 523 (e.g., the slave diagnosis blocks 3221 and 322n) through a multiplexer 513 (e.g., the multiplexer 312).

In an embodiment, the slave diagnosis block 523 may perform the self-diagnosis based on the diagnosis power and generate the diagnosis data. The slave diagnosis block 523 may obtain the temperature data through a temperature sensor 522 (e.g., the temperature sensors 3241 and 324n), and may obtain the failure data through a main power rail 521 (e.g., the main power rails 3211 and 321n). The failure data may include the overcurrent record of the power rail between the main power rail 521 and a system element 529 (e.g., the system elements 3291 and 329n). The self-diagnosis may include the primary diagnosis using the diagnosis power and the secondary diagnosis using the diagnosis power and the system power. A charge controller 540 (e.g., the charge controller 340) may generate the system voltage (VSYS) based on the supply voltage (VBUS) and the system power may be supplied to a power management circuit 520 (e.g., the power management circuits 3201 and 320n) through the system voltage (VSYS).

In another embodiment, a modulator 524 may transmit the diagnosis data by modulating the power signal of the diagnosis power path. For example, the modulator 524 may modulate the power signal by performing the PLC through a current mirroring. A current mirror 525 may be used for the current mirroring. The current mirror 525 may correspond to the current sources 3251 and 325n. A demodulator 514 (e.g., the demodulator 313) may receive the diagnosis data by demodulating the power signal of the diagnosis power path. For example, the demodulator 514 may demodulate the power signal by performing the PLC through the current mirroring. A current sensor 511 may be used for the current mirroring. For example, the current sensor 511 may perform the current mirroring through an input transistor (MPi) and an output transistor (MPo). A mirroring result may be reflected in a sensor voltage (VCS). The sensor voltage (VCS) may be compared with a threshold voltage (VTH) and a digital value (H/L) corresponding to the diagnosis data may be determined.

Figure 6:
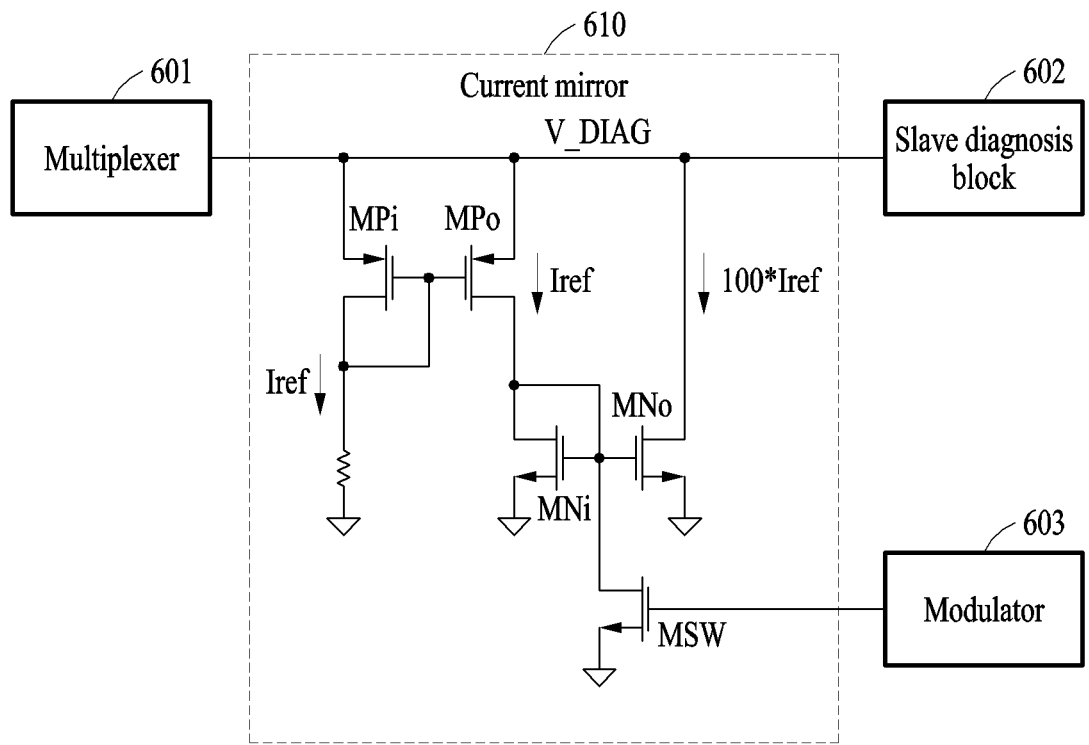
FIG. 6 is a diagram illustrating an example of a current mirror according to an embodiment of the disclosure.

FIG. 6 is a diagram illustrating an example of a current mirror according to an embodiment of the disclosure.

Referring to FIG. 6, a current mirror 610 may include a PMOS current mirror based on PMOSs (MPi, MPo) and an NMOS current mirror based on NMOSs (MNi, MNo). In a case in which the diagnostic voltage (V_DIAG) is applied to a node between a multiplexer 601 (e.g., the multiplexer 312 and the multiplexer 513) and a slave diagnosis block 602 (e.g., the slave diagnosis blocks 3221 and 322n), a voltage obtained by subtracting the threshold voltage of the PMOS (MPi) from the diagnostic voltage (V_DIAG) may be applied to a resistance, thereby generating a current (Iref), and the current (Iref) may be supplied to the NMOS current mirror by the current mirroring. An output current of the NMOS current mirror may be determined according to a size ratio of the NMOS (MNi) and the NMOS (MNo). In a case in which the size ratio of the NMOS (MNi) and NMOS (MNo) is n, the mirroring result may be n times the current (Iref).

In an embodiment, the current mirror 610 may be disabled through a transistor MSW. In a case in which the transistor MSW is turned on, a gate voltage of the NMOS current mirror may drop to disable the current mirror 610. A modulator 603 (e.g., the modulators 3231 and 323n, and the modulator 524) may transmit digital information corresponding to the diagnosis data to the master diagnosis block (e.g., the master diagnosis block 311) by modulating the current supplied from the regulator (e.g., the regulator 314 and the regulator 512) using the transistor (MSW). A modulation current may correspond to the power signal for the PLC.

Figure 7:
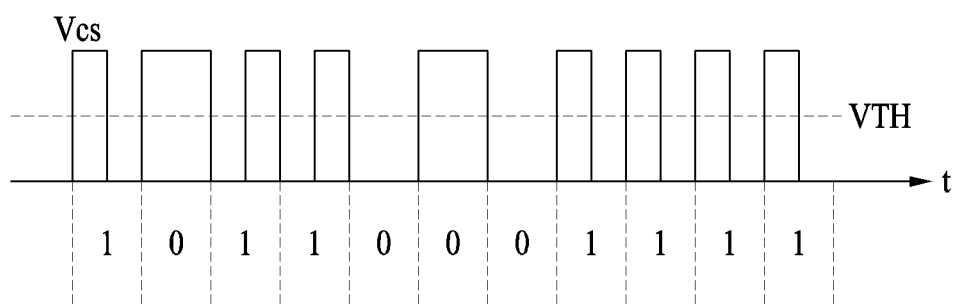
FIG. 7 is a diagram illustrating an example of a powerline communication (PLC) signal according to an embodiment of the disclosure.

FIG. 7 is a diagram illustrating an example of a powerline communication (PLC) signal according to an embodiment of the disclosure.

Referring to FIG. 7, the modulator (e.g., the modulators 3231 and 323n, the modulator 524, and the modulator 603) may modulate the power signal using a signal control block (e.g., the current source (e.g., the current sources 3251 and 325n) and the current mirror (e.g., the current mirror 525 and the current mirror 610)). For example, the modulator may be able or disable the current mirror based on the diagnosis data and such current mirror manipulation may be reflected in a digital state (e.g., digital high or digital low) of the sensor voltage (VCS). The digital information may be transmitted through the current mirror manipulation.

For example, in a case in which the digital state is changed in one clock of a predetermined clock period, digital data of 1 may be represented and in a case in which the digital state is not changed, digital data of 0 may be represented. However, it is also possible to use various modulation and demodulation methods different from that of FIG. 7.

Figure 8:
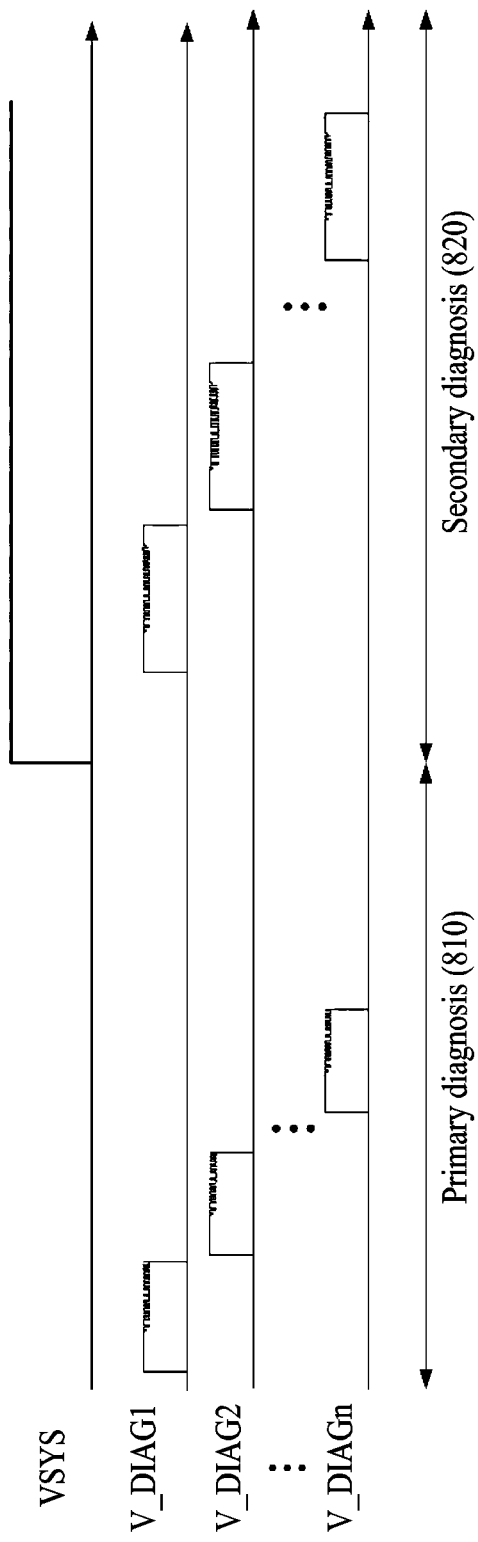
FIG. 8 is a diagram illustrating an example of system power and applying timing of diagnosis power according to an embodiment of the disclosure.

FIG. 8 is a diagram illustrating an example of system power and applying timing of diagnosis power according to an embodiment of the disclosure.

Referring to FIG. 8, during a primary diagnosis 810, with the supply of the system voltage (VSYS) according to the system power is cut off, the diagnosis voltages (V_DIAG1 to V_DIAGn) according to the diagnosis power may be supplied. During a secondary diagnosis 820, both the system voltage (VSYS) and the diagnosis voltages (V_DIAG1 to V_DIAGn) may be supplied. As previously mentioned, the primary temperature data may be extracted during the primary diagnosis 810 and the secondary temperature data and the failure data may be extracted during the secondary diagnosis 820. Since the time taken for the secondary diagnosis 820 may be longer than that of the primary diagnosis 810, the supply time of the diagnosis voltages (V_DIAG1 to V_DIAGN) may be longer during the secondary diagnosis 820 than that of the primary diagnosis 810. A small fluctuation of the diagnosis voltages (V_DIAG1 to V_DIAGn) may indicate the influence of the PLC.

Figure 9:
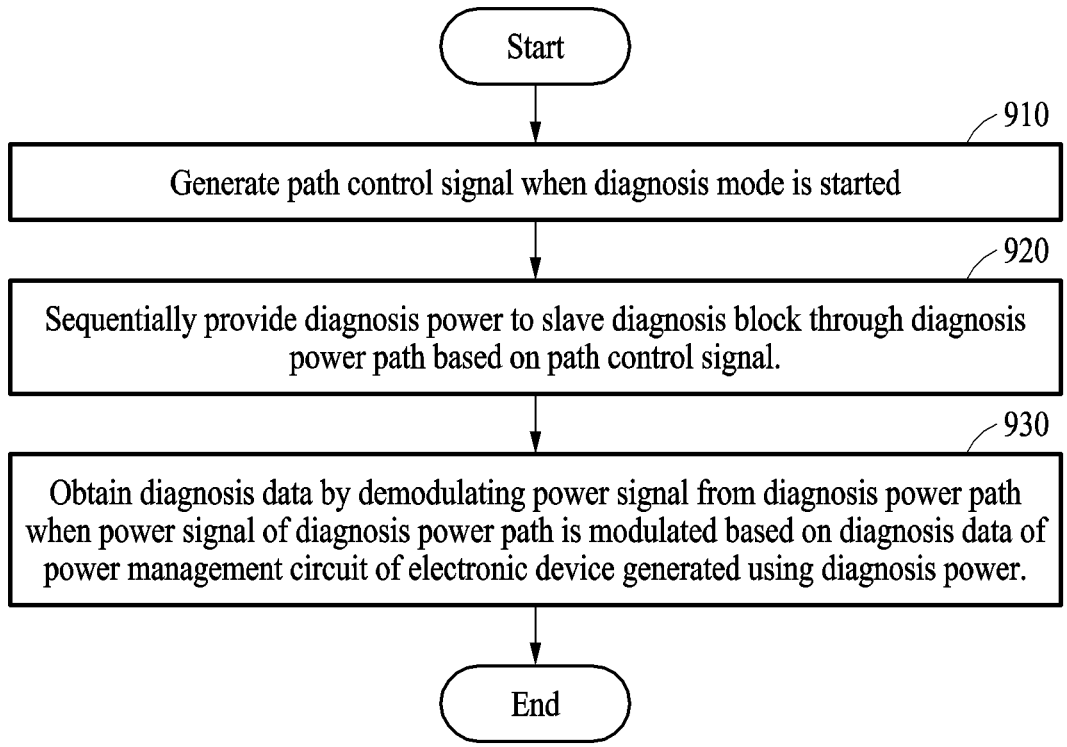
FIG. 9 is a flowchart of a method for diagnosing according to an embodiment of the disclosure.

FIG. 9 is a flowchart of a method for diagnosing according to an embodiment of the disclosure.

Referring to FIG. 9, operations 910, 920 and 930 of various embodiments of FIG. 9 may be sequentially performed or non-sequentially performed. For example, the order of operations 910, 920 and 930 may be changed and/or at least two of operations 910, 920 and 930 may be performed in parallel. The operations 910, 920 and 930 may be performed by at least one component (e.g., the processor 120, the master diagnosis block 311, the slave diagnosis blocks 3221 and 322n, the slave diagnosis block 523, and the slave diagnosis block 602) of the electronic device (e.g., the electronic device 101 and the electronic device 300).

In a case in which the diagnosis mode is started in operation 910, a path control signal may be generated. In operation 920, the diagnosis power may be sequentially provided to the slave diagnosis block through the diagnosis power path based on the path control signal. The diagnosis power path may be distinguished from the system power path that supplies the system power to the system element of the electronic device.

In a case in which the power signal of the diagnosis power path is modulated based on the diagnosis data of the power management circuit of the electronic device generated using the diagnosis power in operation 930, the diagnosis data may be obtained by demodulating the power signal of the diagnosis power path. The diagnosis data may include the diagnosis data of the primary diagnosis performed using the diagnosis power in a state in which the supply of the system power to the power management circuit is cut off and the diagnosis data of the secondary diagnosis performed using the diagnosis power in a state in which the system power is supplied to the power management circuit.

The method for diagnosing may further include generating the diagnosis result based on the diagnosis data. The generating of the diagnosis result may include diagnosing the overheating state of the power management circuit based on a difference between the primary temperature data and the secondary temperature data in a case in which the primary temperature data of the power management circuit is extracted through the primary diagnosis and in a case in which the secondary temperature data of the power management circuit is extracted through the secondary diagnosis.

The electronic device according to various embodiments may be one of various types of electronic devices. The electronic device may include, for example, a portable communication device (e.g., a smartphone), a computer device, a portable multimedia device, a portable medical device, a camera, a wearable device, or a home appliance device. The electronic device according to an embodiment is not limited to those described above.

It should be understood that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., the internal memory 136 or the external memory 138) that is readable by a machine (e.g., the electronic device 101 and the electronic device 300). For example, a processor (e.g., the processor 120) of the machine (e.g., the electronic device 101 and the electronic device 300) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same manner or in a similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A diagnosis device for diagnosing an electronic device, the diagnosis device comprising:
   a master diagnosis block configured to generate a control signal when a diagnosis mode is started;
   a multiplexer configured to sequentially output a diagnosis power through a diagnosis power path based on the control signal;
   a slave diagnosis block that is sequentially supplied the diagnosis power through the diagnosis power path, the slave diagnosis block configured to generate diagnosis data of a power management circuit of the electronic device using the diagnosis power;
   a modulator configured to transmit the diagnosis data by modulating a power signal of the diagnosis power path; and
   a demodulator configured to:
     receive the diagnosis data by demodulating the power signal of the diagnosis power path, and
     provide the diagnosis data to the master diagnosis block.

2. The diagnosis device of claim 1,
   wherein the diagnosis power path is different from a system power path that supplies a system power to a system element of the electronic device, and
   wherein the system element of the electronic device corresponds to an individual functional element of the electronic device including at least one of a processor, memory, an input module, a display module, a sound output module, or an audio module.

3. The diagnosis device of claim 1, wherein the diagnosis data comprises at least a part of temperature data and failure data of the power management circuit.

4. The diagnosis device of claim 3,
   wherein the power management circuit is configured to supply system power to a system element of the electronic device through a power rail, wherein the failure data comprises an overcurrent record of the power rail, and
wherein the system element of the electronic device corresponds to an individual functional element of the electronic device including at least one of a processor, memory, an input module, a display module, a sound output module, or an audio module.

5. The diagnosis device of claim 3, wherein the slave diagnosis block is further configured to perform:
a primary diagnosis using the diagnosis power in a state in which a supply of system power of the power management circuit is cut off; and
a secondary diagnosis using the diagnosis power in a state in which the system power is supplied to the power management circuit.

6. The diagnosis device of claim 5,
wherein primary temperature data of the power management circuit is extracted through the primary diagnosis,
wherein secondary temperature data of the power management circuit is extracted through the secondary diagnosis, and
wherein the master diagnosis block is further configured to diagnose an overheating state of the power management circuit based on a difference between the primary temperature data and the secondary temperature data.

7. The diagnosis device of claim 5, further comprising:
a charge controller configured to:
supply the system power to the power management circuit,
block a supply of the system power at a time of the primary diagnosis, and
allow a supply of the system power at the time of the secondary diagnosis according to the control signal of the master diagnosis block.

8. The diagnosis device of claim 1, wherein the slave diagnosis block and the modulator are disposed in the power management circuit.

9. The diagnosis device of claim 1, wherein the modulator modulates the power signal by performing powerline communication (PLC) through a current mirroring process.

10. The diagnosis device of claim 1, wherein the demodulator is configured to demodulate the power signal by performing powerline communication (PLC) through a current mirroring process.

11. A method for diagnosing an electronic device, the method comprising:
generating a control signal when a diagnosis mode is started;
sequentially providing a diagnosis power to a slave diagnosis block through a diagnosis power path based on the control signal; and
obtaining diagnosis data by demodulating a power signal of the diagnosis power path when the power signal of the diagnosis power path is modulated based on the diagnosis data of a power management circuit of the electronic device generated using the diagnosis power.

12. The method of claim 11,
wherein the diagnosis power path is different from a system power path that supplies a system power to a system element of the electronic device,
wherein the system element of the electronic device corresponds to an individual functional element of the electronic device including at least one of a processor, memory, an input module, a display module, a sound output module, or the audio module, and
wherein the system element of the electronic device receives the system power by using the system power path through a power management circuit comprising the slave diagnosis block.

13. The method of claim 11, wherein the diagnosis data comprises:
diagnosis data of a primary diagnosis performed using the diagnosis power in a state in which a supply of system power of the power management circuit is cut off, and
diagnosis data of a secondary diagnosis performed using the diagnosis power in a state in which a system power is supplied to the power management circuit.

14. The method of claim 13, further comprising:
generating a diagnosis result based on the diagnosis data,
wherein the generating of the diagnosis result comprises diagnosing the overheating state of the power management circuit based on a difference between primary temperature data and secondary temperature data when primary temperature data of the power management circuit is extracted through the primary diagnosis and when secondary temperature data of the power management circuit is extracted through the secondary diagnosis.

15. One or more non-transitory computer-readable storage media storing computer-executable instructions that, when executed by one or more processors individually or collectively, cause the one or more processors to perform the method of claim 11,
wherein the one or more processors are system elements of the electronic device and communicates with the slave diagnosis block through the power management circuit.

16. An electronic device comprising:
a diagnosis control circuit configured to output and provide a diagnosis power through a diagnosis power path; and
a power management circuit configured to:
provide a system power supplied through a system power path to a system element of the electronic device, and
perform a diagnosis using the diagnosis power supplied through the diagnosis power path to generate diagnosis data,
wherein the power management circuit is further configured to transmit the diagnosis data according to the diagnosis by modulating a power signal of the diagnosis power path,
wherein the diagnosis control circuit is configured to receive the diagnosis data by demodulating the power signal of the diagnosis power path,
wherein the diagnosis data comprises temperature data, failure data, or combination thereof of the power management circuit providing the system power to the system element, and
wherein the system element of the electronic device corresponds to an individual functional element of the electronic device including at least one of a processor, memory, an input module, a display module, a sound output module, or an audio module.

17. The electronic device of claim 16, wherein the diagnosis power path is different from a system power path that supplies the system power to the system element of the electronic device.

18. The electronic device of claim 16, wherein the power management circuit is further configured to perform:

a primary diagnosis using the diagnosis power in a state in which a supply of system power to the power management circuit is cut off, and a secondary diagnosis using the diagnosis power in a state in which the system power is supplied to the power management circuit.

19. The electronic device of claim 16, wherein primary temperature data of the power management circuit is extracted through the primary diagnosis, wherein secondary temperature data of the power management circuit is extracted through the secondary diagnosis, and wherein the diagnosis control circuit is further configured to diagnose an overheating state of the power management circuit based on a difference between the primary temperature data and the secondary temperature data.

20. The electronic device of claim 16, wherein the power management circuit and the diagnosis control circuit performs powerline communication (PLC) through a current mirroring process to transmit digital information.

* * * * *